United States Patent

Natsume

[11] Patent Number: 5,477,062
[45] Date of Patent: Dec. 19, 1995

[54] SEMICONDUCTOR WAFER

[75] Inventor: Kiyoshi Natsume, Hamamatsu, Japan

[73] Assignee: Yamaha Corporation, Hamamatsu, Japan

[21] Appl. No.: 339,923

[22] Filed: Nov. 15, 1994

Related U.S. Application Data

[63] Continuation of Ser. No. 988,714, Dec. 10, 1992, abandoned.

[30]  Foreign Application Priority Data

Dec. 13, 1991 [JP] Japan .................................... 3-330933

[51] Int. Cl.⁶ ................................................. H01L 29/06
[52] U.S. Cl. ............................ 257/48; 257/773; 257/775; 437/226
[58] Field of Search ............................. 257/48, 620, 773, 257/775; 437/226

[56] References Cited

U.S. PATENT DOCUMENTS

| | | |
|---|---|---|
| 4,695,868 | 9/1987 | Fisher ...................................... 257/775 |
| 4,835,592 | 5/1989 | Zommer . |
| 5,003,374 | 3/1991 | Vokoun, III . |
| 5,051,807 | 9/1991 | Morozumi .............................. 257/620 |
| 5,096,855 | 3/1992 | Vokoun, III . |
| 5,206,181 | 4/1993 | Gross . |

FOREIGN PATENT DOCUMENTS

| | | | |
|---|---|---|---|
| 54-22263 | 6/1979 | Japan ...................................... 257/48 |
| 61-166057 | 7/1986 | Japan ...................................... 257/48 |
| 3-268441 | 11/1991 | Japan ...................................... 257/48 |

Primary Examiner—J. Carroll
Attorney, Agent, or Firm—Loeb & Loeb

[57] ABSTRACT

A semiconductor wafer is formed with a plurality of semiconductor chips each having a plurality of ICs or LSIs, a plurality of scribe lines formed between the semiconductor chip areas for dicing the plurality of ICs or LSIs as semiconductor chips, and a plurality of test elements formed on the scribe lines for testing the performance of basic elements and the quality of manufacturing processes. A plurality of slits intersecting with the scribe line are formed at a predetermined pitch in the test element serving as a test electrode a probe for electrical measurement contacts.

13 Claims, 7 Drawing Sheets

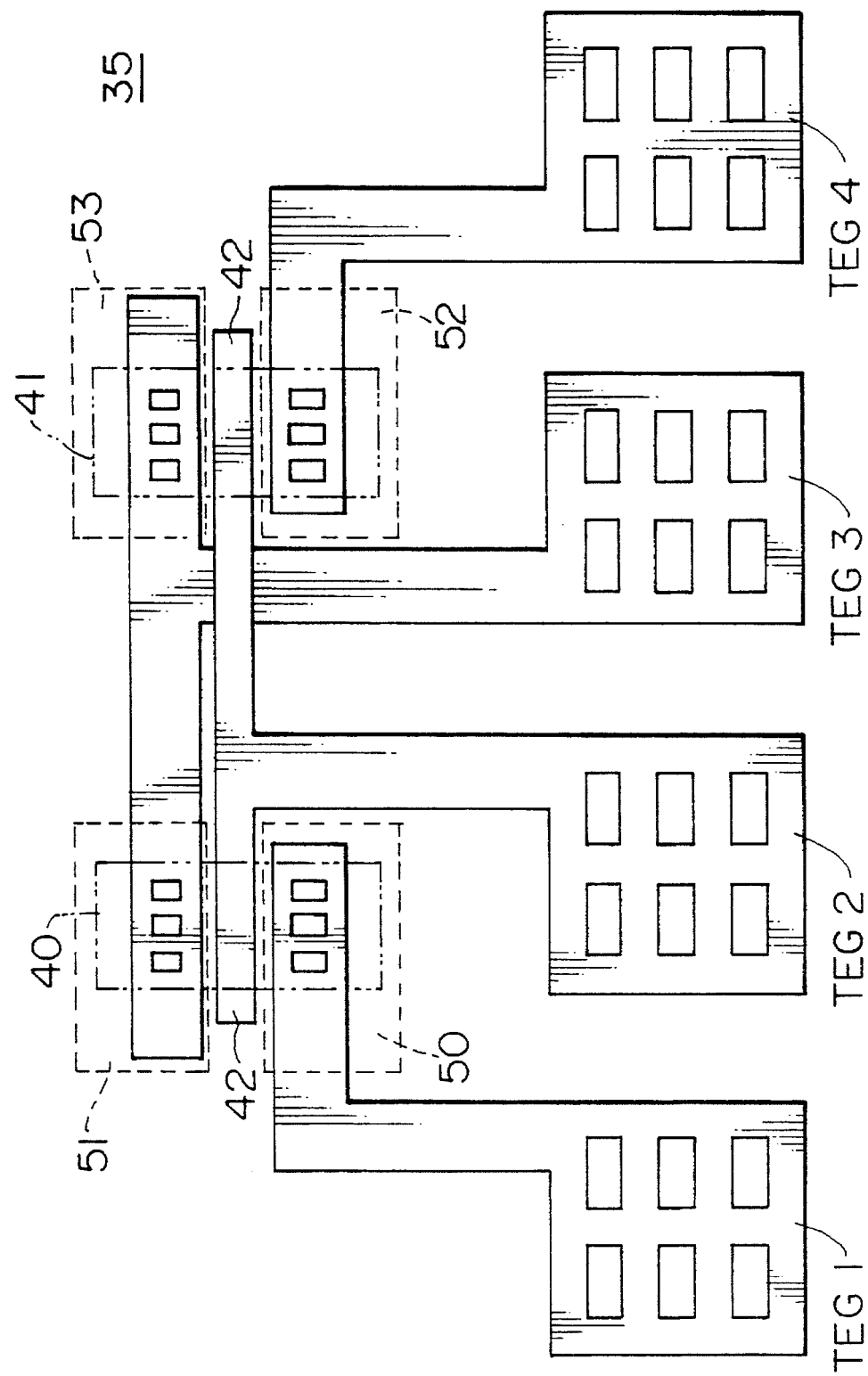

SEMICONDUCTOR WAFER

This is a continuation of application Ser. No. 07/988,714 filed Dec. 10, 1992, now abandoned.

BACKGROUND OF THE INVENTION a) Field of the Invention

The present invention relates to a semiconductor wafer termed with a plurality of chip areas each having integrated circuits (ICs) or (large scale integrated circuits (LSIs).

b) Description of the Related Art

On a semiconductor wafer formed with a plurality of chip areas each having ICs and LSIs, there are formed, in addition to patterns of chips, test element groups (TEG) having various test elements on scribe lines for dicing the semiconductor wafer into semi conductor chips by using a dicing apparatus, TEG being used for testing the performance of basic elements and the quality of manufacturing processes.

Most of the test elements constituting TEG have a size of 50 to 100 μm square. Some test elements have various configurations similar to basic elements. However, most of the test elements includes test electrodes 1 shown in FIG. 6 having a simple rectangle allowing a probe contact for electrical measurement. In FIG. 6, reference numeral 2 represents a scribe line, and reference numeral 3 represents a passivation film.

The test electrodes 1 and other test elements formed on the scribe lines 2 are eventually cut by a dicing apparatus from the upper portion of the wafer above a dicing margin 4, as shown in FIGS. 7A and 7B. FIG. 7A is a plan view, and FIG. 7B is a cross sectional view taken along line VIIB—VIIB of FIG. 7A.

The width of the scribe Nine 2 is generally 100 μm more or less. The width of the dicing margin 4 is generally 30 μm more or less. In FIGS. 7A and 7B, reference numeral 5 represents an insulating film, reference numeral 6 represents silicon substrate, and reference numeral 7 represents a curled metal piece ready to be pealed off.

As the semiconductor wafer is diced by a dicing apparatus, the dicing margin 4 of the test electrode 1 traverses along the central area of the electrode 1 separating it.

In many cases, the test electrode 1 on the scribing margin 4 remains as metal pieces 7 on the semiconductor chip surface without being fully scribed. The metal pieces 7 are removed from the semiconductor surface at the succeeding process including a washing process at the dicing process.

Even after the succeeding process, some metal pieces 7 of the test electrode 1 remain on the upper edge of a semiconductor chip. Such a metal piece has a small diameter and width in the order of 10 μm, but the length thereof is as long as the length (50 to 100 μm) of the test electrode at a maximum.

Such a long metal piece 7 may be pealed off at the succeeding process such as the assembly process of plastic molding, in the shape off a metal piece 8 such as shown in FIG. 8, and mixed into the mold.

Since this metal piece 8 is as long as 50 to 100 μm, it may enter between IC or LSI pins, bonding pads, or the like, respectively spaced apart only by a distance 50 to 70 μm, and short-circuit these pins or pads.

SUMMARY Of THE INVENTION

It is an object of the present invention to provide a semiconductor wafer having a low possibility of short-circuiting trouble or the like even if metal pieces are produced from test electrodes when dicing the semiconductor wafer.

According to one aspect of the present invention, there is provided a semiconductor wafer comprising: a plurality of semiconductor chip areas each formed with a plurality of integrated circuits or large scale integrated circuits; scribe lines formed between said plurality of semiconductor chip areas; and a plurality of test elements formed between said plurality of semiconductor chip areas and aligned with said scribe lines, for testing the performance of basic elements and the quality of manufacturing processes, wherein at least one slit intersecting with said scribe line is formed in said test element used as a test electrode which a probe for electrical measurement contacts.

According to another aspect of the present invention, there is provided a semiconductor wafer comprising: a plurality of semiconductor chip areas each formed with a plurality of integrated circuits or large scale integrated circuits; scribe lines formed between said plurality of semiconductor chip areas; and a plurality of test elements formed between said plurality of semiconductor chip areas and aligned with said scribe lines, for testing the performance of basic elements and the quality of manufacturing processes, wherein a plurality of slits intersecting with said scribe line is formed in said test element used as a test electrode which a probe for electrical measurement contacts, said slit including an intersecting portion intersecting with said scribe line and a parallel portion generally parallel with said scribe line formed near at said scribe line.

According to the present invention, the length of a metal piece, if any, produced from test electrodes when dicing a semiconductor wafer, is set smaller than the distance between IC or LSI pins, bonding pads, or the like. Therefore, the possibility of short-circuiting these pins or pads can be lowered.

BRIEF DESCRIPTION OF THE DRAWINGS

FIG. 1D is a plan view of a test element.

DETAILED DESCRIPTION OF THE PREFERRED EMBODIMENTS

An embodiment of the present invention will be described with reference to the accompanying drawings.

Figure 1A:
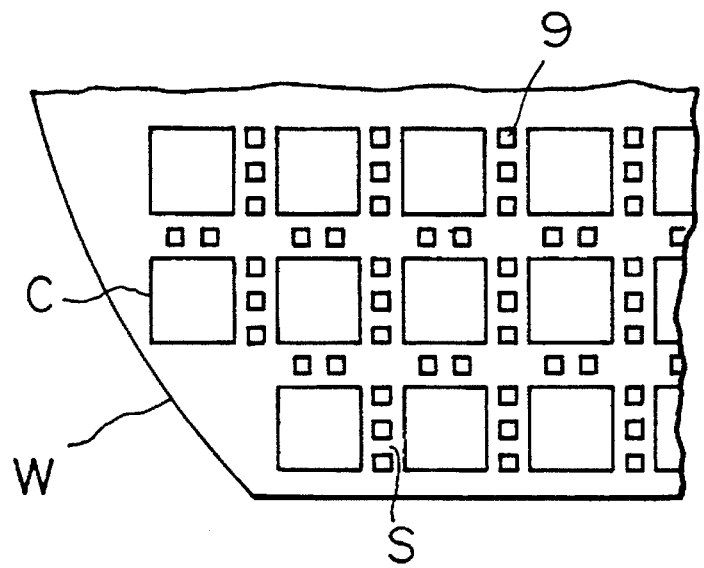
FIGS. 1A and 1B are a partial plan view of a semiconductor wafer of an embodiment according to the present invention, and a plan view showing the structure of a test electrode formed on the wafer.

FIG. 1A is a partial plan view of a semiconductor wafer according to the embodiment of the present invention.

A semiconductor wafer W is made of a silicon monocrystal plate, and has a disk shape with one end portion being cut off perpendicular to the radial direction. A number of chip areas C are formed on the wafer W. A scribe area S of predetermined width is provided between adjacent chips. Test circuits 9 are formed on each scribe area S.

Figure 1B:
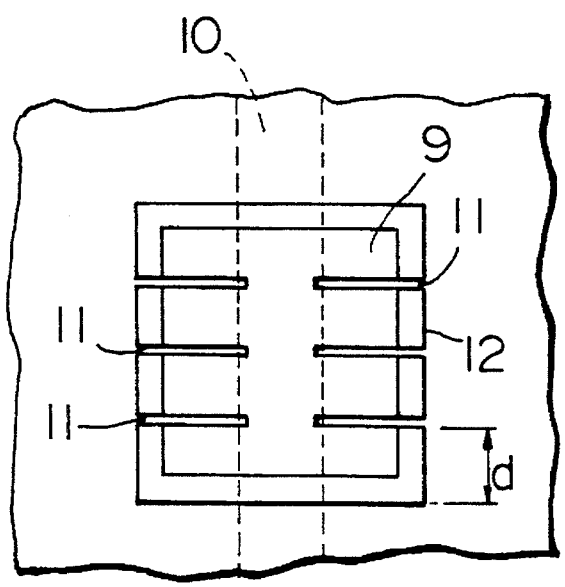

FIG. 1B is a plan view showing the structure of a test electrode 9, which is disposed so that the opposing sides of the electrode 9 are parallel with the scribe line 10. Slits 11 are formed in the test electrode at the pitch of d in the direction perpendicular to a scribe line 10. Each slit 11 extends from one side of the test electrode to the opposite side, and terminates within the scribe line 10, the terminating points of a pair of facing slits leaving an area having a predetermined width within the scribe line 10. The width of the slit 11 is determined depending on the size of a probe for the electrical measurement and a deformation of the test electrode upon contact with the probe. However, the slit is not made unnecessarily wider so as not to degrade the function of the test electrode 9. For example, it is preferable to set the width to about 1 to 3 μm.

The depth of the slit 11 is not necessary to reach the area (about 30 μm width at the center of the scribe line) expected to be the scribing margin, but it is set to a minimum so as not to obstruct the contact of the probe. For example, the terminating end off the slit allows a distance of 20 μm to the center of the scribing margin (leaving an area about 40 μm width).

The above-described pitch d is determined considering the assembly specification of ICs or LSIs and the distance between bonding pads. For example, the pitch is set in the coder of 10 to 15 μm.

In FIG. 1B, reference numeral 12 represents a passivation film.

Figure 2A:
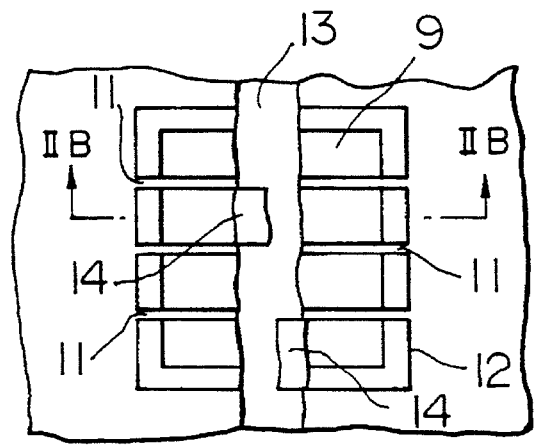
FIGS. 2A and 2B are a partial plan view of a diced semiconductor wafer and a cross sectional view taken along line IIB—IIB of FIG. 2A.
Figure 2B:
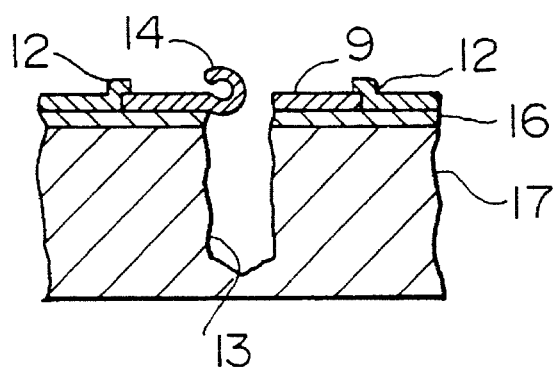

As the semiconductor wafer having the test electrodes constructed as above is diced by a dicing apparatus, metals formed on the margin 13 of the scribe line 10 of the test electrode 9 are cut and separated, as shown in FIGS. 2A and 2B, from metal pieces 14 left on the surface of the semiconductor chip surface. Almost all metal pieces are removed from the semiconductor chip surface at the succeeding processes including washing at the dicing process.

Of the test electrode 9, some of the metal pieces, such as curled metal pieces 14, on the scribing margin 13, remain on the upper edges of the semiconductor chip under the condition that they are easily to be pealed off. In FIGS. 2A and 2B, reference numeral 16 represents an insulating film, and reference numeral 17 represents a silicon substrate. Assuming that the same size of the test electrode 9 is used, the diameter and width of the curled metal piece 14 are about 10 μm same as conventional, but the length is the pitch d of the slits 11, or in this example, about 10 to 15 μm, shorter than the conventional case.

Figure 3:
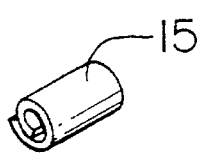
FIG. 3 is a perspective view showing an example of a metal piece.

Even if such a curled metal piece 14 is pealed off at the succeeding process such as an assemble process of plastic molding, and enters the mold in the form of a metal piece shown in FIG. 3 and locates between IC or LSI pins, lead wires, or bonding pads spaced apart by 50 to 70 μm or so, a possibility of short-circuiting these members is extremely low.

Figure 4A:
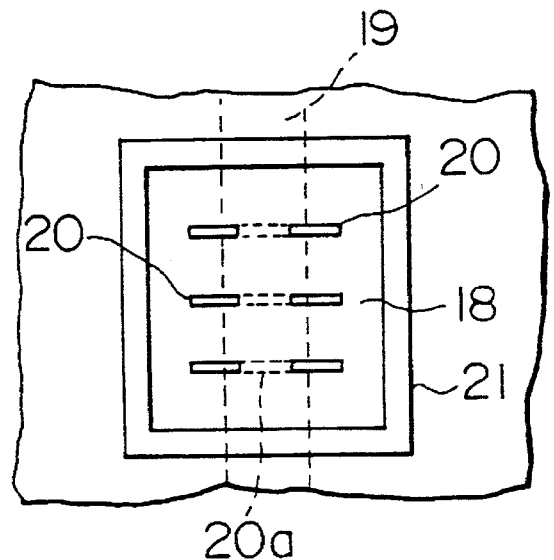
FIGS. 4A and 4B are plan views showing test electrodes formed on a semiconductor wafer according to another embodiment of the present invention.

Next, another embodiment of the present invention will be described with reference to FIGS. 4A and 4B. FIG. 4A is a plan view showing the structure of a test electrode of this embodiment formed on a semiconductor wafer. Different from the above-described embodiment, the test electrode 18 is formed with slits 20 in the direction perpendicular to the scribe line 19 only within the internal area of the test electrode 18. Reference numeral 21 represents a passivation film. To provide a width sufficient for forming a curled metal piece, the slit 20 extends outside of the scribe line 19 to some extent as shown in FIG. 4A. Instead of the slits 20 formed on the right and left sides of the scribe line 19 leaving the central area, slits 20a continuously extending over the central area may be used if a resistance increase poses no problem. The pitch between slits is set to about 10 to 15 μm.

Figure 4B:
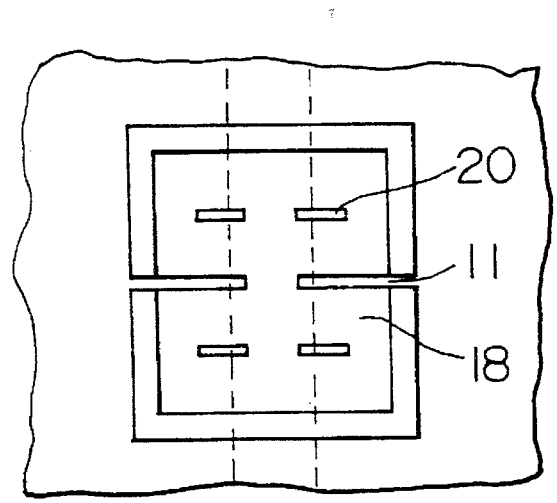

As shown in FIG. 4B, a combination of slits 20 formed within the internal area of the test electrode and slits 11 extending from one side of the test electrode into the scribing margin may also be used.

The function of this embodiment is substantially the same as that of the above-described embodiment, and so the description thereof is omitted.

Figure 5:
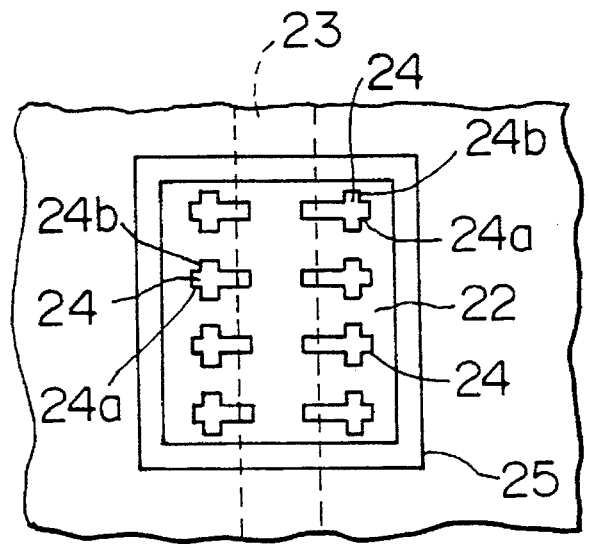
FIG. 5 is a plan view showing the structure of a test electrode formed on a semiconductor wafer according to a still further embodiment of the present invention.
Figure 6:
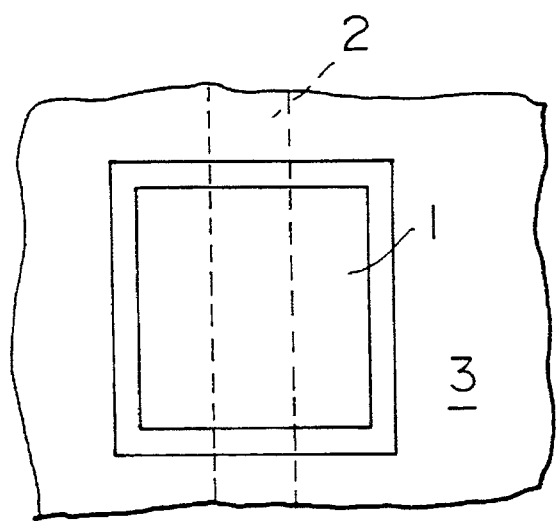
FIG. 6 is a plan view showing the structure of a conventional test electrode.
Figure 7A:
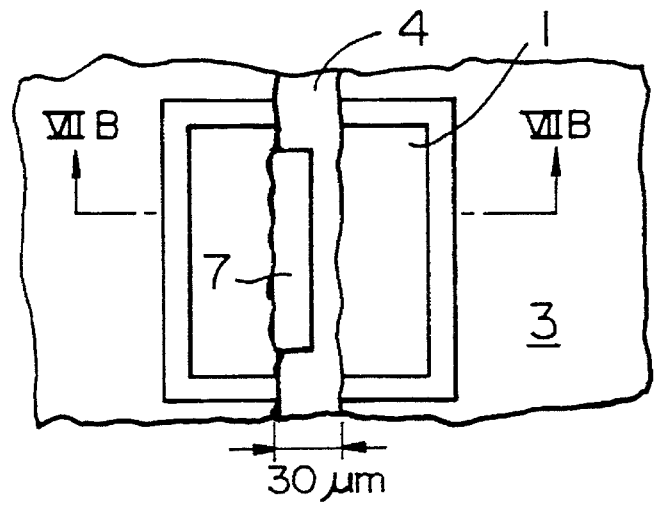
FIGS. 7A and 7B are a partial plan view of a conventional diced semiconductor wafer and a cross sectional view taken along line VIIB—VIIB of FIG. 7A.
Figure 7B:
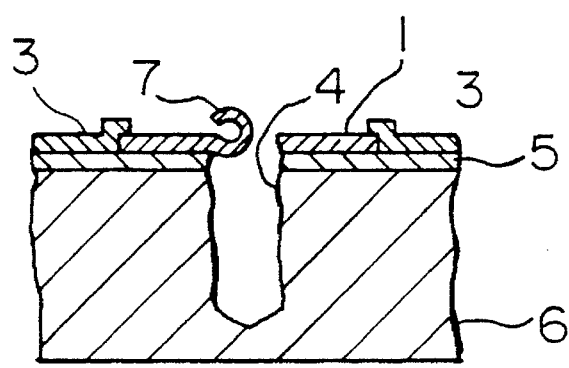
Figure 8:
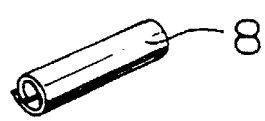
FIG. 8 is a perspective view showing an example of a metal piece.

A still further embodiment of the present invention will be described with reference to FIG. 5. FIG. 5 is a plan view showing the structure of a test, electrode 22 of the embodiment formed on a semiconductor wafer. Each slit 24 formed within the internal area of the test electrode 22 has intersecting portion 24a intersecting with the scribe line 23 and a parallel portion 24b generally parallel with the scribe line 23 at the area near the scribe line 23. Reference numeral 25 represents a passivation film.

As the semiconductor wafer having the test electrodes constructed as above is diced by a dicing apparatus, metal pieces are likely to be broken at the parallel portions 24b of the slits 24. Therefore, metal pieces are likely to be removed at the intermediate processes, reducing the number of metal pieces finally mixed in the mold.

Figure 1C:
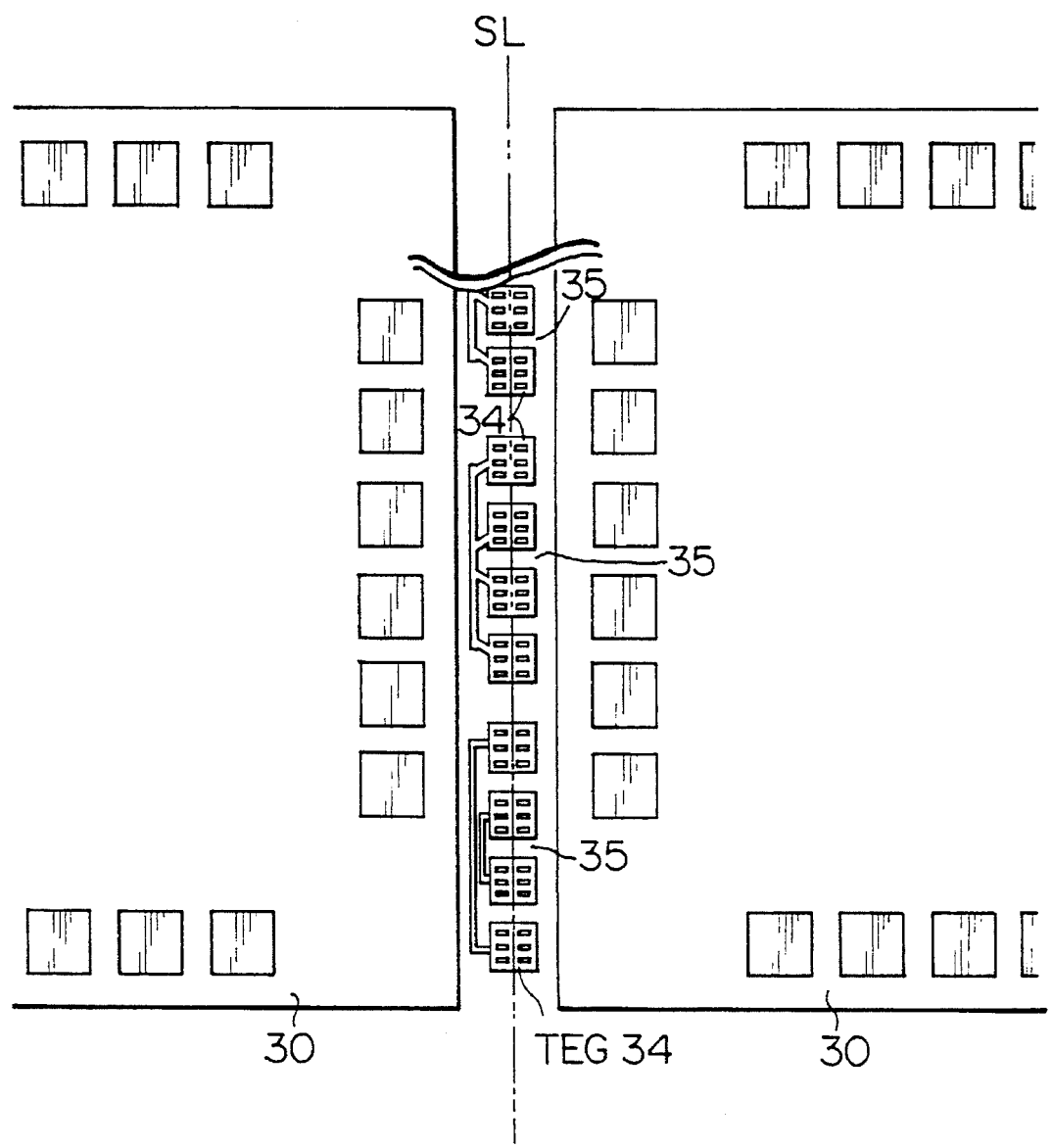
FIG. 1C is a plan view of test electrodes.

FIG. 1C is a plan view showing the configuration of test electrodes according to the present invention. The plural test electrodes TEG 34 according to the present invention are provided along a scribe line SL laid between semiconductor chips 30. In this embodiment, twenty to thirty test electrodes are provided along the single scribe line SL at an intermediate area laid between two chips 30. A set of plural test elements or circuits 35 each of which includes four or five electrodes TEG 34 are provided to measure various characteristic parameters of a wafer or of the chip. The Lest elements or circuit 35 includes a test field to measure a characteristic parameter and test electrodes connected thereto. The characteristic parameters to be measured are threshold voltages of a p-channel transistor or an n-channel transistor, resistivity of polysilicon layer, contact resistivity, etc.

FIG. 1D shows one example of a test element or circuit with electrodes TEG of the present invention to measure threshold voltages of test field, i.e., a p-channel transistor and an n-channel transistor. In the example, TEG indicates a test electrodes of the present invention. TEG 1 is an electrode connected to drain 50. TEG 2 is an electrode connected to a gate electrode 42. TEG 3 is an electrode connected to a interconnected sources 51 and 53 of an n-channel transistor 40 and a p-channel transistor 41. TEG 4 is an electrode connected to a drain 52.

In FIG. 1A, a set of plural test circuits are provided every regions between the chips, but a set of the test electrodes may be provided per at least every five or six chips which corresponds to one photolithographic shot performed with a reticle having five or six units of photomask-pattern thereon, which is used in a photolithographic process. In the case of a chip production on a six-inch size silicon wafer, about sixty photolithographic shots are necessary. Therefore, it is necessary to provide with at least sixty sets of test circuits.

In the above-described embodiments, forming the test electrodes 9, 18, and 22 can be realized by a single masking process similar to the conventional case. The field insulating films formed under the test electrodes 9, 18, and 22 may be etched at the succeeding process of forming a hole in the passivation film. However, there is no fear of etching the field insulating film under the control ability of a generally used dry etching process or wet etching process.

Although the present invention has been described in connection with the preferred embodiments, the present invention is not intended to be limited only to those embodiments. For example, it is apparent that various changes, improvements, combinations and the like can be made by those skilled in the art.

I claim:

1. A semiconductor wafer comprising:

a plurality of semiconductor chip areas thereon;

scribe areas provided between said plurality of semiconductor chip areas, wherein said semiconductor wafer may be separated along a scribe line running through said scribe areas to produce a plurality of semiconductor chips;

a test circuit, provided on at least one of said scribe areas and having at least one metal electrode, said metal electrode having a plurality of parallel slits therein which are symmetrically provided with respect to said scribe area, each of said plurality of parallel slits having a first terminating point disposed near to a scribe line and a second terminating point disposed away from said scribe line, said parallel slits disposed so as to shorten metal peel-offs produced when said semiconductor chip areas are separated.

2. A semiconductor wafer according to claim 1, wherein said slits extend to two opposite edges of said electrode.

3. A semiconductor wafer according to claim 1 wherein at least one slit has an intersecting portion which intersects with an edge of said scribe line and a parallel portion which runs substantially parallel to said scribe line.

4. A semiconductor wafer according to claim 1, wherein said slits have a width of 1 to 3 microns.

5. A semiconductor wafer according to claim 1, wherein said plurality of parallel slits are provided at a predetermined pitch.

6. A semiconductor wafer according to claim 5, wherein said pitch is 10 to 15 microns.

7. A semiconductor wafer according to claim 1, wherein said slits align with a direction perpendicular to said scribe line.

8. A semiconductor wafer according to claim 1, wherein each of said second terminating points of said slits is disposed near an edge of said metal electrode.

9. A semiconductor wafer according to claim 1, wherein said first terminating points of said slits are separated into two groups, with a first set of said first terminating points disposed near one edge of said scribe line and a second set of said first terminating points disposed near a second edge of said scribe line.

10. A semiconductor wafer according to claim 9, wherein said first set of said first terminating points is separated from said second set of said first terminating points by a distance substantially equal to the width of said scribe line.

11. A semiconductor wafer according to claim 9, wherein said first set of said first terminating points is separated from said second set of said first terminating points by a distance of less than 40 microns.

12. A semiconductor wafer comprising:

a plurality of semiconductor chip areas each formed with a plurality of integrated circuits or large scale integrated circuits;

scribe lines formed between said plurality of semiconductor chip areas; and a plurality of test elements formed between said plurality of semiconductor chip areas and aligned with said scribe lines, for testing the performance of basic elements and the quality of manufacturing processes, wherein each of said plurality of test elements includes at least one electrode disposed over a scribe line, said at least one electrode having a plurality of slits formed in parallel therein, each of said slits extending from said scribe line in a direction perpendicular to said scribe line so that each of said plurality of slits intersects an edge of said scribe line, wherein each of said plurality of slits includes an intersecting portion intersecting with said scribe line and a parallel portion generally parallel to said scribe line.

13. A semiconductor wafer according to claim 12, wherein said slit is formed by leaving opposite side areas parallel with said scribe line and a central area of said scribe line,

* * * * *